US006400619B1

United States Patent
Hsu et al.

(10) Patent No.: US 6,400,619 B1
(45) Date of Patent: Jun. 4, 2002

(54) MICRO-CELL REDUNDANCY SCHEME FOR HIGH PERFORMANCE EDRAM

(75) Inventors: Louis L. Hsu, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/841,950

(22) Filed: Apr. 25, 2001

(51) Int. Cl.[7] .............................. G11C 7/00; G11C 29/00
(52) U.S. Cl. .............. 365/200; 365/189.07; 365/230.03
(58) Field of Search .......................... 365/200, 230.03, 365/189.07, 225.7

(56) References Cited

U.S. PATENT DOCUMENTS

| | | | | |
|---|---|---|---|---|
| 4,355,376 A | * | 10/1982 | Gould | 365/200 |
| 5,325,334 A | | 6/1994 | Roh et al. | 365/201 |
| 5,469,401 A | | 11/1995 | Gillingham | 365/200 |
| 5,638,385 A | | 6/1997 | Fifield et al. | 371/40.1 |
| 5,691,946 A | | 11/1997 | DeBrosse et al. | 365/200 |
| 5,841,712 A | | 11/1998 | Wendell et al. | 365/200 |
| 5,848,009 A | * | 12/1998 | Lee et al. | 365/200 |
| 6,055,204 A | * | 4/2000 | Bosshart | 365/230.06 |
| 6,141,268 A | | 10/2000 | Chen et al. | 365/200 |
| 6,275,406 B1 | * | 8/2001 | Gibson et al. | 365/49 |

* cited by examiner

*Primary Examiner*—Son Mai
(74) *Attorney, Agent, or Firm*—Scully, Scott, Murphy & Presser; Robert M. Trepp, Esq.

(57) ABSTRACT

A new micro-cell redundancy scheme for a wide bandwidth embedded DRAM having a SRAM cache interface. For each bank of micro-cell array units comprising the eDRAM, at least one micro-cell unit is prepared as the redundancy to replace a defected micro-cell within the bank. After array testing, any defective micro-cell inside the bank is replaced with a redundancy micro-cell for that bank. A fuse bank structure implementing a look-up table is established for recording each redundant micro-cell address and its corresponding repaired micro-cell address. In order to allow simultaneous multi-bank operation, the redundant micro-cells may only replace the defective micro-cells within the same bank. When reading data from eDRAM, or writing data to eDRAM, the micro-cell array address is checked against the look-up table to determine whether that data is to be read from or written to the original micro-cell, or the redundant micro-cell. The micro-cell redundancy scheme is a flexible and reliable method for high-performance eDRAM applications.

18 Claims, 6 Drawing Sheets

| MCRA1 | MCRA2 | MCRA3 | MCRA4 | MCRA5 | MCRA6 | MCRA7 | MCRA8 |
|---|---|---|---|---|---|---|---|
| MCRA1 | MCRA2 | MCRA3 | MCRA4 | MCRA5 | MCRA6 | MCRA7 | MCRA8 |
| MCA1 | MCA9 | MCA17 | MCA25 | MCA33 | MCA41 | MCA49 | MCA57 |
| MCA2 | MCA10 | MCA18 | MCA26 | MCA34 | MCA42 | MCA50 | MCA58 |
| (MCA3) | MCA11 | MCA19 | MCA27 | MCA35 | MCA43 | MCA51 | MCA59 |
| MCA4 | MCA12 | MCA20 | MCA28 | MCA36 | MCA44 | MCA52 | MCA60 |
| MCA5 | MCA13 | MCA21 | MCA29 | MCA37 | MCA45 | MCA53 | MCA61 |
| MCA6 | MCA14 | MCA22 | MCA30 | MCA38 | MCA46 | MCA54 | MCA62 |
| (MCA7) | MCA15 | MCA23 | MCA31 | MCA39 | MCA47 | MCA55 | MCA63 |
| MCA8 | MCA16 | MCA24 | MCA32 | MCA40 | MCA48 | MCA56 | MCA64 |
| | | | | | | | |
| SSA1 | SSA2 | SSA3 | SSA4 | SSA5 | SSA6 | SSA7 | SSA8 |

FIG. 3

| MCRA | V | Failed MCA |
|---|---|---|
| 1 | 0 | XXXXX |
| 2 | 1 | MCA12 |
| 3 | 1 | MCA23 |
| 4 | 1 | MCA25 |
| 5 | 0 | XXXXX |
| 6 | 0 | XXXXX |
| 7 | 1 | MCA51 |
| 8 | 1 | MCA55 |

FIG. 4

Flow Chart of Read Operation

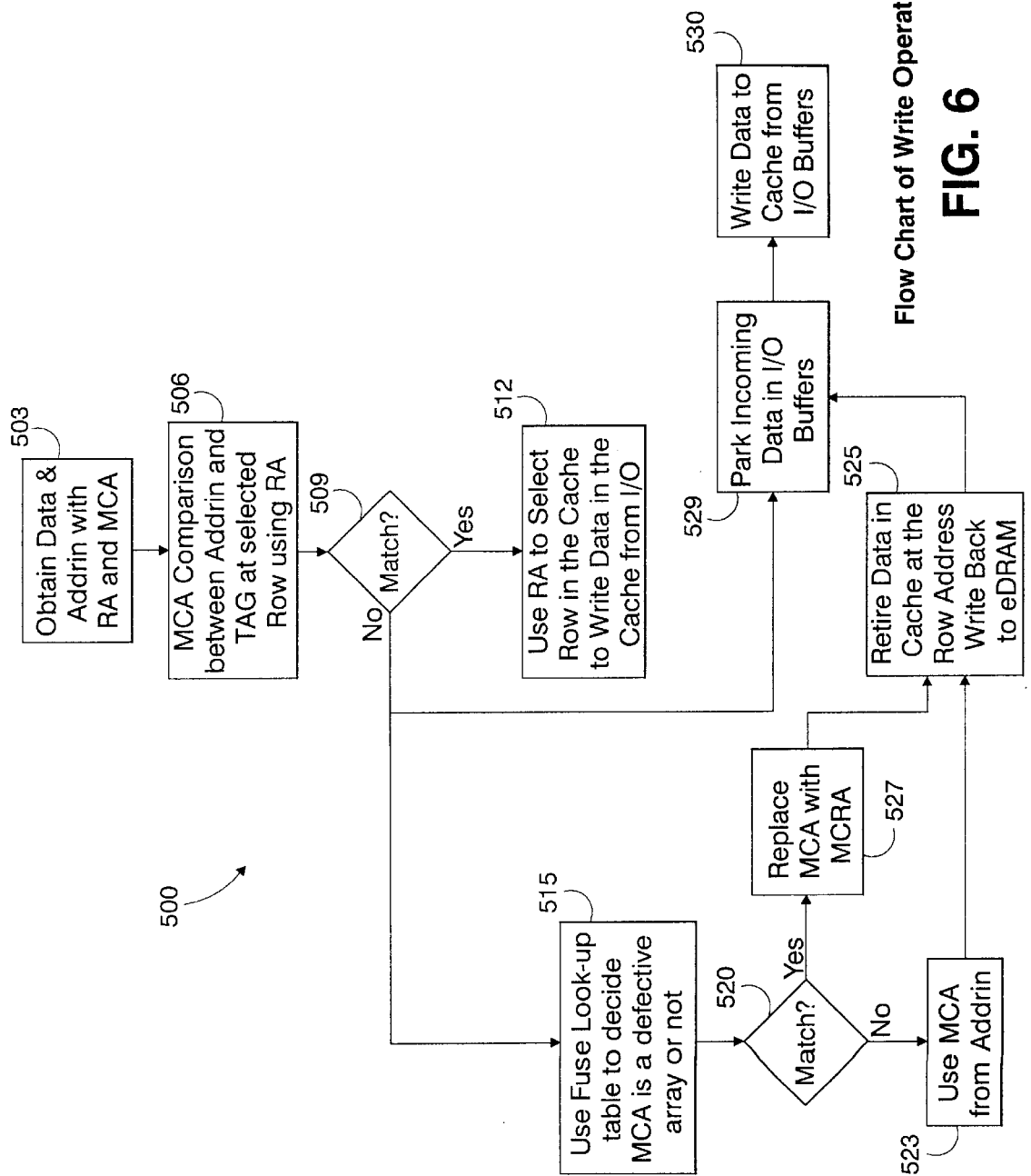

MICRO-CELL REDUNDANCY SCHEME FOR HIGH PERFORMANCE EDRAM

BACKGROUND OF THE INVENTION

1. Field of the Invention

This invention relates generally to Dynamic Random Access Memory structures and systems, and particularly, to an embedded DRAM (eDRAM) micro-cell array architecture including a micro-cell redundancy scheme.

2. Discussion of the Prior Art

Embedded DRAMs with wide data bandwidth and wide internal bus width have been proposed for L2 (level-2) cache to replace conventional SRAM cache. Since each DRAM memory cell is formed by one transistor and a capacitor, the physical size of DRAM cache is significantly smaller than that of six-transistor SRAM for same density. In order to meet performance requirements, DRAMs for L2 cache are made of a plurality of blocks (here called micro-cells). A block is a small DRAM array unit formed by a plurality of wordlines (typically from 64 to 128) and a plurality of bitline pairs (typically from 64 to 128). The size of a micro-cell is much smaller (e.g., 16X to 256X) than a block of a conventional stand-alone DRAM. Normally, only one micro-cell of a bank of an eDRAM is activated. Sometimes, micro-cells from different banks can be accessed simultaneously. The read and write speed of such eDRAMs can be quite fast due to very light wordline and bitline loading.

In order to effectively utilize the large DRAM cache size for cache, a small SRAM array about the same size of an eDRAM micro-cell is used. The SRAM is served as the cache interface that is placed in between eDRAM and the requesting processor(s). A wide internal bus (64 to 1024) is provided for data transferring among eDRAM, SRAM and the processor(s). To be more specific, data residing in the cells of a wordline of a micro-cell of eDRAM are read and amplified in a group of primary sense amplifiers before being sent to corresponding secondary sense amplifiers. These data are then sent to the SRAM and stored in the cells at the same wordline location. At the same time, the TAG memory records the micro-cell address of which the data are in the cache. The data are finally transferred to the requesting processor(s). Normally, neither column address nor column decoding is necessary for the wide bandwidth eDRAM configuration.

One challenge of the wide bandwidth design is that it is difficult to provide an effective row and column redundancy scheme to fix any defective elements. This is especially difficult for the column redundancy since most of the existing approaches requires a column address to indicate failed column elements for repair. In a conventional DRAM array, bitline pairs are grouped hierarchically by the column address. Each time, only one data from a group of the bitline pairs is selected to be transferred out via the local and global datalines. Therefore, the most common redundancy approach for the conventional DRAM is to provide repair for a whole group of bitlines using the provided column address. However, for a wide bandwidth eDRAM, data from every pair of bitlines must all be sent out. Alternately, all the data lines from eDRAM are simultaneously fed to SRAM, and all the datalines from SRAM are then fed to the processor(s). For such a one-to-one direct wiring, if any of them fail and no redundancy is offered, the chip must be discarded. If redundancy bitlines are provided, it is not easy to correctly replace the failed bitlines and reroute them so the data would still be kept in right order. It is especially hard when there is no column address available.

It would be highly desirable to provide a micro-cell redundancy scheme for repairing defected memory arrays of a wide data bandwidth embedded DRAM.

It would be further highly desirable to provide a micro-cell array eDRAM architecture that includes a micro-cell redundancy replacement scheme wherein a micro-cell array itself is utilized as the unit for redundancy replacement. That is, if any eDRAM wordline, bitline or cell is found defective, then the whole micro-cell would be replaced.

SUMMARY OF THE INVENTION

It is an object of the present invention to provide a micro-cell redundancy scheme for repairing defected memory arrays of a wide data bandwidth embedded DRAM.

It is another object of the present invention to provide a micro-cell array eDRAM architecture that includes a micro-cell redundancy replacement scheme wherein a micro-cell array itself is utilized as the unit for redundancy replacement.

Another object of the present invention is to provide micro-cell redundancy architectures for flexible and reliable eDRAM array repairing.

It is a further object of the present invention to provide a system and method for effectively testing the micro-cell redundancy elements.

According to the principles of the invention, there is provided for an embedded semiconductor dynamic random access memory (eDRAM) memory architecture comprising one or more banks of micro-cell arrays with each micro-cell comprising a plurality of DRAM memory elements for storing data, a micro-cell array redundancy system comprising: a plurality of redundant micro-cell arrays, one or more of the plurality of redundant micro-cells associated with a micro-cell array bank; a mechanism for mapping eDRAM micro-cell arrays previously determined as being defective with a corresponding good redundant micro-cell array implemented as a replacement array for storing data; and a logic circuit for facilitating data read and write operations, the logic circuit implementing the mapping mechanism for enabling read and write access to a replacement redundant micro-cell array associated with a micro-cell array determined as defective.

The micro-cell redundancy system may be implemented for an embedded DRAM cache having a SRAM cache interface. For each memory array bank, at least one micro-cell is prepared as the redundancy to replace a defected micro-cell within the bank. After array testing, any defective micro-cell inside a bank is replaced with a redundancy micro-cell for that bank. A look-up table is established and implemented, for example, by a fuse bank, where each redundant micro-cell address versus its corresponding repaired micro-cell address is recorded. Two embodiments of micro-cell redundancy are proposed, with a preferred embodiment limiting redundant micro-cells to only replace the defective micro-cells within the same bank in order to allow simultaneous multi-bank operation. When reading data from eDRAM, or writing data to eDRAM, the micro-cell array address must be checked to determine whether that is the original micro-cell, or the redundant micro-cell.

The micro-cell redundancy scheme of the invention provides a flexible and reliable method for high-performance, wide bandwidth eDRAM applications.

BRIEF DESCRIPTION OF THE DRAWINGS

Further features, aspects and advantages of the apparatus and methods of the present invention will become better understood with regard to the following description, appended claims, and the accompanying drawings where:

FIG. 3 illustrates a second embodiment of the micro-cell block redundancy scheme 300 according to the invention.

FIG. 4 illustrates an example fuse bank structure 20 corresponding to the micro-cell block redundancy scheme 200 according to the first embodiment shown in FIG. 2.

FIG. 6 is a flow diagram 500 depicting the write operation of the eDRAM 60 implementing micro-cell redundancy according to the invention.

DETAILED DESCRIPTION OF THE PREFERRED EMBODIMENTS

As mentioned earlier, and depicted in FIG. 1, an embedded DRAM 60 typically comprises a DRAM array comprising a plurality of micro-cells, denoted as MCA1, MCA2, MCA3, etc. Each micro-cell comprises a small array unit, the size of which is very small compared to those of the stand-alone DRAM. Therefore, it becomes less efficient to use any conventional redundancy schemes, e.g., row redundancy and column redundancy. Rather, according to the invention, the micro-cell itself is utilized as a unit for redundancy replacement. Thus, if any wordline, bitline or cell is found defective, then the whole micro-cell is replaced. Being the micro-cell is such a small array, the probability of having a defected element is much smaller than that of the stand-alone DRAM. Thus, it is not effective to provide extra rows and columns in each micro-cell used as redundancy because it may either be too many or not enough for repairing. For example, if cluster type of defect occurs, there may not be enough redundancy elements provided for repairing. However, if there is scatter type of defect, then the redundancy provided for each micro-cell may be left unused and hence, become wasteful.

Figure 1:
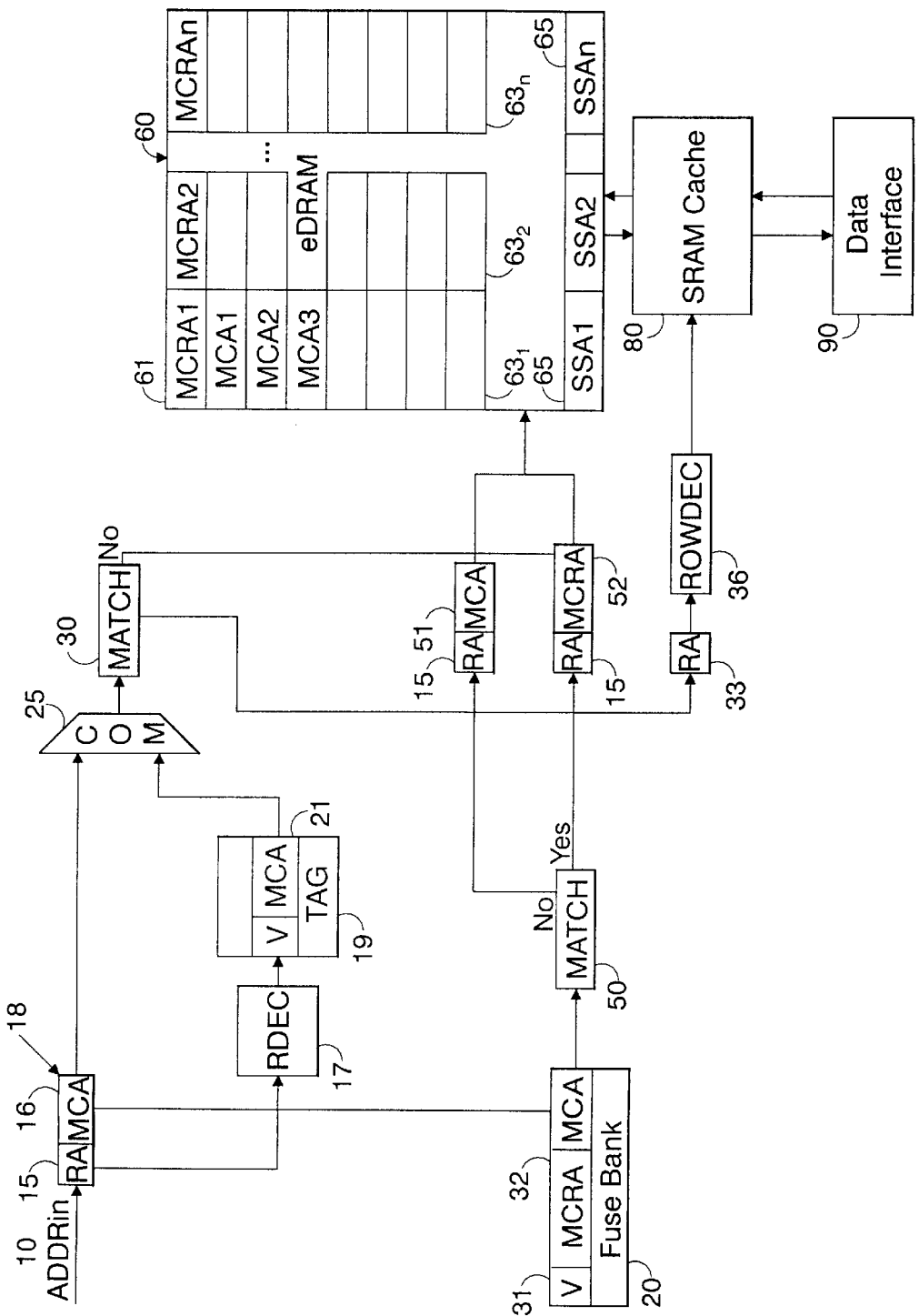
FIG. 1 particularly depicts the simplified micro-cell eDRAM architecture with micro-cell redundancy according to the invention.

FIG. 1 particularly depicts the simplified micro-cell eDRAM architecture 60 with micro-cell redundancy according to the invention. As shown in FIG. 1, the embedded eDRAM architecture comprises a plurality of stacked micro-cell units MCA1, MCA2, MCA3, etc., each unit comprising an array and a first sense amplifier block (not shown). Preferably, the micro-cells units are organized as a series of columns defining a micro-cell bank $63_1$, $63_2$, ..., $63_n$ with each bank including a secondary sense amplifier block 65. According to the invention, there is provided at least one redundancy micro-cell unit MCRA1, MCRA2, ..., MCRAn 61 for each respective bank $63_1$, $63_2$, ..., $63_n$ of micro-cell units in the array. In this case, redundancy micro-cell unit MCRA1 is used as the redundancy element for a first bank $63_1$ having a plurality of micro-cells, e.g., from 8 to 64 micro-cells depending upon the manufacturing processes implemented.

For a read or write operation to the eDRAM array, an incoming address 10 including a row address bit field (RA) 15 and block address bit field (or micro cell address, MCA) 16 is first received in an address buffer register 18. The row address, RA is used to decode a TAG memory 19 via a row decoder 17. After the row is selected, the valid bit in the TAG is checked. If the decoder 17 determines a valid bit set to high, for example, (or V=1), this indicates that the corresponding row in the SRAM cache has been stored with a set of valid data. As shown in FIG. 1, the decoder 17 determines from the TAG 19 the eDRAM micro-cell address 21 from which this valid data originated. Otherwise, if the valid bit set had been set to low, for example, (or V=0), this indicates that there is no valid data stored in the SRAM corresponding to that particular row.

As shown in FIG. 1, a multiplexor device 25 conveys the incoming RA 15 and the MCA block address bit field 16 of the address 10 and the micro-cell address 21 of the TAG (MCA TAG) 19 to a comparator device 30 for determining whether a match is present. If it is determined that the incoming address and the TAG address match, then this indicates that the targeted data is stored in the cache. In response, the row address RA 33 from the incoming address 10 is used to select a row of the SRAM cache 80 via a row decoder element 36. On the other hand, if the incoming address and the TAG address do not match, or if the valid bit of the TAG 21 is set low, i.e., V=0, then a "miss" signal 31 is generated which indicates that the data is not in the SRAM. It should be understood that each operation, whether it be a read or write, must be directed to the specific row and micro-cell of the eDRAM 60. The correct micro-cell location is now decided by the MCA or, as will be described herein in greater detail, from the $MCRA_n$ generated from a fuse bank 20.

Figure 2:
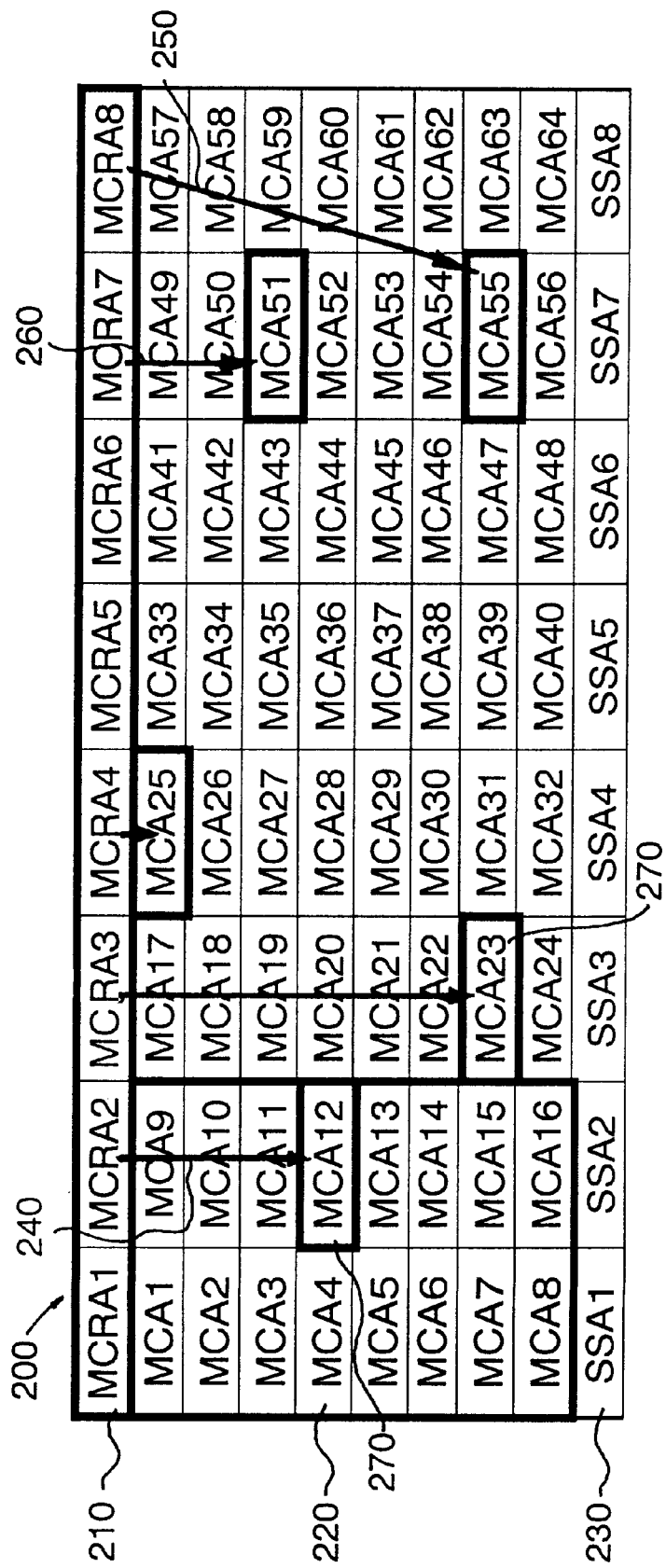
FIG. 2 illustrates a first embodiment of the micro-cell block redundancy scheme 200 according to the invention.

More specifically, as shown in FIG. 1 and described in greater detail herein with respect to FIGS. 2 and 3, the MCA address component 16 from the incoming address 10 is input to comparator device 50 for comparison against each of the MCA addresses stored in the fuse bank 20. The fuse bank 20 preferably comprises a fuse programmable array defining a look-up table that includes each MCRA 61 and the corresponding $MCA_n$. During array testing, any element inside a micro-cell, if detected to be defective, will be assigned a redundant micro-cell unit for replacement. At that moment, the micro-cell (MCA) address and the redundant micro-cell (MCRA) address 32 are programmed in the fuse bank 20 as a pair. Additionally, a valid bit 31 indicated as "V" is set high (e.g., V=1) indicating that the redundancy element is being used. An example of a fuse latch circuit as well as comparison method are described in greater detail in commonly owned U.S. Pat. No. 5,691,946, entitled "Row Redundancy Block Architecture", the contents and disclosure of which is incorporated by reference as if fully set forth herein. When it is determined by comparator device 50 that there exists a corresponding MCRA match for the input MCA address 16, then the redundancy micro-cell address 52 is read and will be used to locate the micro-cell in the eDRAM array. However, if there is no match detected, or the valid bit is set "low" indicating no valid data, then the original MCA address 51 from incoming address is used for decoding the eDRAM.

FIG. 2 illustrates a first embodiment of the micro-cell block redundancy scheme 200 according to the invention. In this first embodiment, for example, two redundant micro-cell units (MCRA1 and MCRA2) 210 are provided in a bank 220 comprising 16 micro-cells (MCA1 to MCA16) arranged in two columns. As shown in FIG. 2 by way of example, redundant micro-cell unit MCRA2 is used to replace a defective micro-cell MCA12 270 which replacement is indicated by arrow 240. Similarly, as shown by way of example, redundant micro-cell unit MCRA3 replaces MCA23, redundant micro-cell unit MCRA4 replaces MCA25, and redundant micro-cell unit MCRA3 replaces MCA23, as indicated by arrow 250, and so on. In this first embodiment, a redundant micro-cell may only replace a defective micro-cell in its own bank. The reason is that sometimes, more than one bank may be activated and a cross-bank replacement will prohibit such operation.

FIG. 3 illustrates a second embodiment of the micro-cell block redundancy scheme 300 according to the invention. In this second embodiment, for example, all the micro-cells in a bank are formed in one column 340 however, more than one redundancy micro-cell (MCRA$_n$ 320 may be provided for each bank. As shown in FIG. 3 by way of example, redundancy micro-cell MCRA1 is used to replace micro-cell MCA3 310 and redundancy micro-cell MCRA1 is used to replace micro-cell MCA7 315. In this embodiment, two rows of redundancy 320, are used to replace its corresponding bank 340 of the eDRAM array 350. The secondary sense amplifier group including SSA1 to SSA8 is shown located at the bottom of the eDRAM array 350.

FIG. 4 illustrates an example fuse bank structure 20 corresponding to the micro-cell block redundancy scheme 200 according to the first embodiment shown in FIG. 2. As shown in FIG. 4, the use bank structure 20 comprises a look-up table indicating each redundancy micro-cell address 282 and the address 284 of the corresponding replaced micro-cells. It should be understood that it is within the purview of skilled artisans to implement other types of programmable means for establishing the look-up table 20 of FIG. 4. For example, a small flash memory array, or a mask programmable read-only-memory may all be used for the same purpose.

Furthermore, it is contemplated that a conventional BIST (Built-in Self-Test) method may be applied for array testing of the micro-cells, e.g., in a sequential manner—one cell after another, including both regular micro-cells and the redundant micro-cells. BIST techniques are described in the reference to N. Sakashita entitled "A 1.6 GB/sec Data Rate 1 GB Synchronous DRAM with Hierarchical Square-Shaped Memory Block and Distributed Bank Architecture," I.E.E.E. Journal of Solid State Circuits, Vol. 31, No. 11, November 1996, PP. 1645–1655, and in the reference to J. Dreibelbis entitled "Processor-Based Built-In Self Test for Embedded DRAM," I.E.E.E Journal of Solid State Circuits, Vol. 33, No. 11, November 1998, pp. 1731–1739, the contents and disclosures of each of which are incorporated by reference as if fully set forth herein. Any element in a micro-cell that is found defective, regardless of whether it is a wordline, bitline or a single cell, that cell is marked as defective. Once the testing is done, a corresponding fuse bank such as shown in FIG. 4 is programmed with the micro-cell replacement information.

During power-on, the fuse latch circuit (not shown) will be set and ready for address comparison. In the following example, redundancy cell MCRA1 is not used, redundancy cell MCRA2 is used to replace normal cell MCA12, and redundancy cell MCRA3 replaces normal cell MCA23, and so on. According to this example, the comparisons are performed in such a way that five (5) of the eight (8) valid MCA addresses will be compared with the incoming MCA address. If any of them match, then the selected MCA is a defective one, and the corresponding redundancy MCRA address from the table will be used to decode the eDRAM. Thus, the test algorithm for micro-cell redundancy is relatively simple and easy to be implemented.

Figure 5:
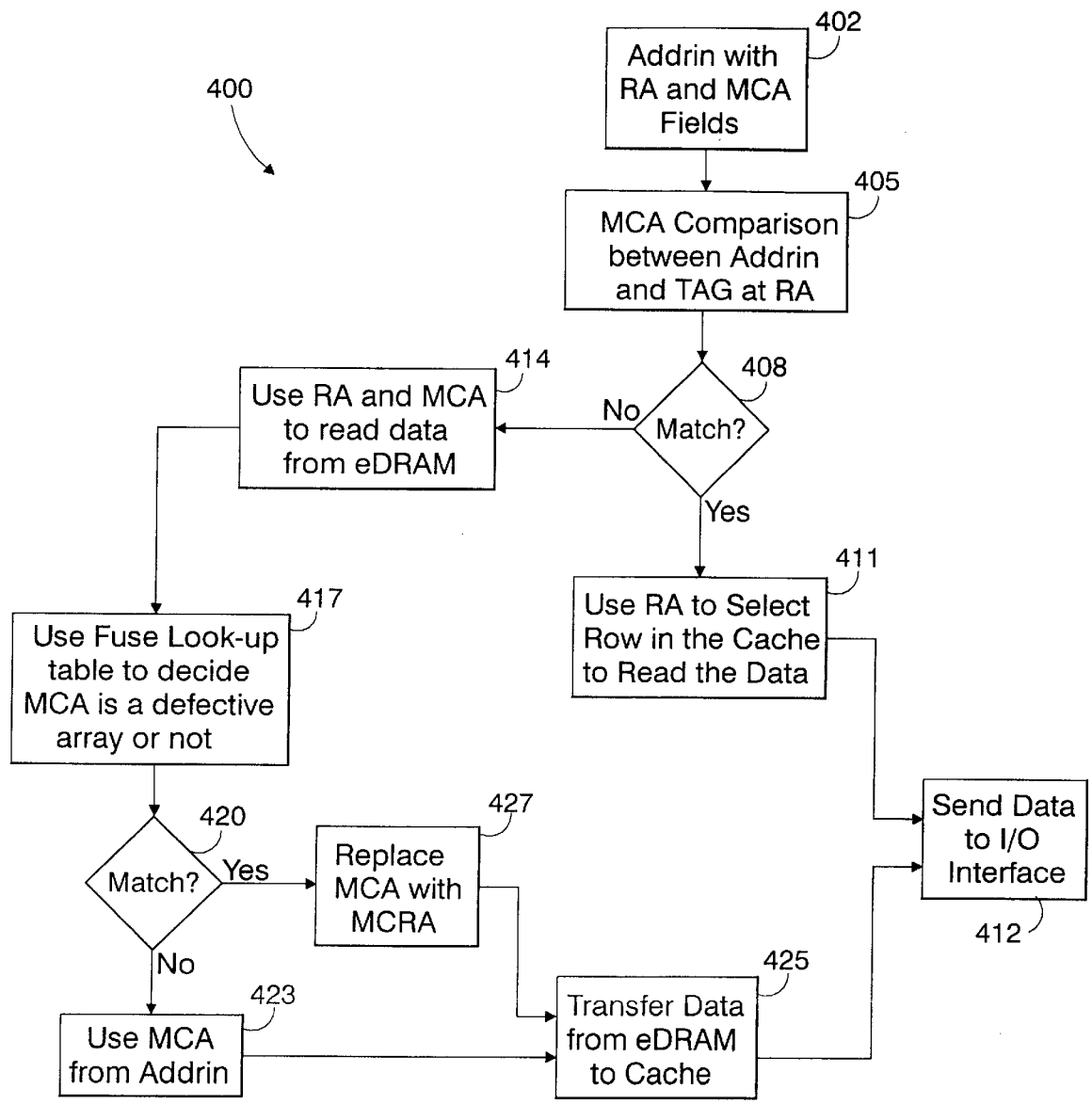
FIG. 5 is a flow diagram 400 depicting the read operation of the eDRAM 60 implementing micro-cell redundancy according to the invention.

FIG. 5 is a flow diagram 400 depicting the read operation of the eDRAM 60 implementing micro-cell redundancy according to the invention. As illustrated at a first step 402, whenever a read command is issued, an incoming address is provided by the processor containing both row address field (RA) and a micro-cell address field (MCA). As indicated at step 405, from the stored TAG information, the row address (RA) information is used to find the micro-cell address of the data that is stored in the SRAM. Next, at step 408, the MCA from incoming address is compared with the MCA stored in the TAG. If it is determined that the incoming address of the MCA is identical or matches the MCA stored in the TAG, then the RA is used to select the row in the cache, read and transfer the data to the cache processor, as indicated at steps 411 and 412. If, on the other hand, the MCA from the incoming address and MCA stored in the TAG do not match, then the data is not in the SRAM cache, and must be read from the eDRAM. Thus, as indicated at step 414, the RA and MCA are used to decode the eDRAM to get to the row of the block where the correct data resides. Consequently, as indicated at step 417, the fuse bank structure (FIG. 4) is implemented to determine whether MCRA and V information exist for the corresponding MCA. That is, at step 420, it is determined whether the MCA corresponding to the input address is a defective array or not by virtue of a MCA/MCAR match determined by the fuse bank comparison structure (FIG. 1). If, at step 420, it is determined that V=0, for example, then the MCA is the original micro-cell. and the data from eDRAM is transferred to SRAM directly without going to the redundancy block, as indicated at step 423 and 425. If, however, at step 420, it is determined that V=1, then the original micro-cell in the eDRAM is the defective one and is replaced by a redundant micro-cell (MCRA) as indicated at step 427. Consequently, the address of the redundancy micro-cell is retrieved from the fuse bank, and the data correctly transferred at step 425.

FIG. 6 is a flow diagram 500 depicting the write operation of the eDRAM 60 implementing micro-cell redundancy according to the invention. As shown in FIG. 6, at step 503, both an incoming address comprising both the RA and MCA, and the corresponding data to be written, are provided by the processor. Then, at step 506 and 509, a comparison is made of the MCA from the incoming address against the MCA from the TAG at address RA to decide if there is a cache hit or miss. If, as determined at step 509, a cache hit occurs, then data will be written to SRAM cache using RA from the incoming address at step 512. If it is determined at step 509 that a cache miss occurs, then the incoming data is first parked in a buffer register (not shown) as indicated at step 529. At this point, the old data in the cache must be "retired", or written back to the eDRAM before the new data can be stored in the cache in the same row location. To accomplish this, as indicated at step 515, the MCA from the TAG is used to check whether there is a corresponding MCRA using the fuse bank. If, at step 520, it is determined that V=0, for example, then this indicates that no redundant micro-cell is used for that micro-cell. Thus, as executed at steps 523 and 525, the old data is written from the cache at RA location back to eDRAM using the address RA and MRA from the TAG. If, however, at step 520, it is determined that V=1, then the micro-cell of the old data is actually a redundant one, the redundant micro-cell (MCRA) address is used to write the data back to eDRAM as indicated at step 524. In other words, the old data in the cache is written back to a redundant micro-cell at step 525. After the old data in the cache is "retired", the new data are written to the cache from the buffers as indicated at step 530, and the information in the TAG is updated.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. In an embedded semiconductor dynamic random access memory (eDRAM) memory architecture comprising one or more banks of micro-cell array units with each individual micro-cell comprising a plurality of independently addressable DRAM memory elements for storing data, a micro-cell array redundancy system comprising:

a plurality of independently addressable redundant micro-cell array units, one or more of said plurality associated with a micro-cell array bank;

a mechanism for mapping eDRAM micro-cell array units previously determined as being defective with a corresponding good redundant micro-cell array unit implemented as a replacement array for storing data, said mechanism mapping an address of a redundant micro-cell array unit with an address of a corresponding defective micro-cell array unit; and a logic circuit for facilitating eDRAM data read and write operations, said logic circuit retrieving a mapped address of a redundant micro-cell array unit and enabling read and write access to said redundant micro-cell array unit upon determination of a data operation targeted for an associated micro-cell array unit determined as defective, wherein a whole micro-cell array unit is replaced by said redundant micro-cell array unit.

2. The micro-cell array redundancy system as claimed in claim 1, wherein said mapping mechanism comprises a look-up table for associating a good redundant micro-cell array based on the address of a corresponding defective micro-cell array.

3. The micro-cell array redundancy system as claimed in claim 1, wherein said logic circuit includes a comparator mechanism for comparing an input address of a target micro-cell array location subject to a current read or write operation against a list of addresses of defective micro-cell arrays, and enabling said read or write operation at an address corresponding to a redundant micro-cell array mapped to said target micro-cell array if defective.

4. The micro-cell array redundancy system as claimed in claim 3, wherein said mapping mechanism implements bit flag for indicating whether an original micro-cell associated with said current input address array is defective, said logic circuit determining status of said bit flag and enabling access of data in said original micro-cell array for data read operations when said bit flag indicates no defect.

5. The micro-cell array redundancy system as claimed in claim 1, comprising a plurality of "n" micro-cell arrays and a plurality of "m" redundant micro-cell arrays, wherein n>m.

6. The micro-cell array redundancy system as claimed in claim 5, wherein a ratio of n/m is in the range of about 10 to 20.

7. The micro-cell array redundancy system as claimed in claim 1, wherein each said micro-cell memory array is formed of a plurality of wordlines and a plurality of bitlines.

8. The micro-cell array redundancy system as claimed in claim 7, wherein a number of said wordlines is in the range from about 64 to 512, and a number of said bitlines in the range from about 64 to 512.

9. The micro-cell array redundancy system as claimed in claim 1, wherein said plurality of "n" micro-cell arrays is organized as one or more banks of arrays, each bank having one or more redundant micro-cell arrays associated therewith.

10. The micro-cell array redundancy system as claimed in claim 2, wherein said look-up table is implemented as a fuse bank structure.

11. The micro-cell array redundancy system as claimed in claim 1, wherein said eDRAM memory is a wide bandwidth cache memory having an SRAM cache interface.

12. A method for implementing redundancy in an embedded semiconductor dynamic random access memory (eDRAM) comprising one or more banks of micro-cell array units with each micro-cell array unit comprising a plurality of independently addressable DRAM memory elements for storing data said method comprising:

a) providing a plurality of independently addressable redundant micro-cell array units, one or more of said plurality associated with a bank of micro-cell array units;

b) providing means for mapping of a replacement redundant micro-cell array unit with a micro-cell array unit previously determined as being defective, said means mapping an address of a redundant micro-cell array unit with an address of a corresponding defective micro-cell array unit;

c) enabling data read or write operations to be performed at a redundant micro-cell array unit by retrieving a mapped address location corresponding to said redundant micro-cell array unit associated with a defective target micro-cell array unit targeted for a data read or write operation, wherein a whole micro-cell array unit is replaced by said redundant micro-cell array unit.

13. The method for implementing redundancy as claimed in claim 12, wherein said enabling step c) includes the step of:

comparing an input address of a target eDRAM location subject of a current data read or write operation against a list of addresses corresponding to defective micro-cell array units; and, determining said address location corresponding to a redundant micro-cell array unit associated with a defective target micro-cell array unit having an address matching said input address.

14. The method for implementing redundancy as claimed in claim 13, wherein said mapping step b) includes implementing bit flag for indicating whether an original micro-cell array associated with a current input address array is defective, said comparing step further including:

determining a status of said bit flag; and, accessing data of said original micro-cell array for data read operations when said bit flag indicates no defect.

15. A micro-cell redundancy scheme for an embedded DRAM (eDRAM) cache having a SRAM cache interface, said eDRAM cache comprising one or more banks of memory array units, said scheme comprising:

at least one memory array unit implemented as a redundant memory array unit for replacing a defected micro-cell within a bank;

mechanism for mapping address locations of memory array units previously determined as being defective with a corresponding address location of redundant memory array unit implemented as a replacement;

mechanism for determining whether that data is to be read from or written to an original memory array unit or a corresponding redundant memory array unit in response to a microprocessor request, said mechanism retrieving a mapped address of a good redundant micro-cell array unit and enabling a data read or write operation to be performed upon determination of a data operation targeted for a corresponding defective micro-cell array unit, wherein a whole micro-cell array unit is replaced by said redundant micro-cell array unit.

16. The micro-cell redundancy scheme for an embedded DRAM (eDRAM) cache as claimed in claim 15, further comprising an array testing device for determining defective memory array units in said cache.

17. The micro-cell redundancy scheme for an embedded DRAM (eDRAM) cache as claimed in claim 16, wherein said mapping mechanism comprises a fuse bank structure established for recording each redundant memory array unit address and its corresponding defective memory array unit in response to said array testing.

18. The micro-cell redundancy scheme for an embedded DRAM (eDRAM) cache as claimed in claim 16, wherein a redundant memory array unit replaces the defective memory array units within the same bank in order thereby permit simultaneous multi-bank operation for cache read and write operations.

* * * * *